United States Patent
Chuang et al.

(10) Patent No.: US 8,368,136 B2
(45) Date of Patent: Feb. 5, 2013

(54) INTEGRATING A CAPACITOR IN A METAL GATE LAST PROCESS

(75) Inventors: Harry Chuang, Hsin-Chu (TW);
Tzung-Chi Lee, Banciao (TW);
Kong-Beng Thei, Hsin-Chu (TW);
Sheng-Chen Chung, Jhubei (TW);
Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 328 days.

(21) Appl. No.: 12/256,132

(22) Filed: Oct. 22, 2008

(65) Prior Publication Data

US 2010/0001332 A1      Jan. 7, 2010

Related U.S. Application Data

(60) Provisional application No. 61/078,149, filed on Jul. 3, 2008.

(51) Int. Cl.
*H01L 27/04* (2006.01)

(52) U.S. Cl. ......... 257/306; 257/E27.034; 257/E21.444; 438/244

(58) Field of Classification Search ............. 257/306, 257/310, E27.034, E21.396, E21.444, E21.453; 438/244, 387
See application file for complete search history.

(56) References Cited

U.S. PATENT DOCUMENTS

| 5,168,075 | A | 12/1992 | Kuo | |
|---|---|---|---|---|
| 6,545,336 | B2 * | 4/2003 | Kobayashi et al. | 257/499 |
| 6,699,766 | B1 | 3/2004 | Taravade et al. | |
| 6,972,451 | B2 * | 12/2005 | Delpech et al. | 257/304 |
| 7,288,807 | B1 * | 10/2007 | Akamatsu | 257/296 |
| 7,315,054 | B1 | 1/2008 | Moench et al. | |
| 7,776,731 | B2 * | 8/2010 | Junker et al. | 438/591 |
| 2006/0017115 | A1 * | 1/2006 | Tu et al. | 257/371 |
| 2007/0057343 | A1 * | 3/2007 | Chinthakindi et al. | 257/532 |
| 2007/0069342 | A1 * | 3/2007 | Inaba | 257/666 |
| 2007/0176259 | A1 * | 8/2007 | Yoshinaga | 257/532 |
| 2007/0228440 | A1 | 10/2007 | Chaudhry et al. | |

OTHER PUBLICATIONS

Chinese Patent Office, Office Action dated Dec. 30, 2010; Application No. 200910151365.3, 4 pages.

* cited by examiner

*Primary Examiner* — Wensing Kuo
(74) *Attorney, Agent, or Firm* — Haynes and Boone, LLP

(57) ABSTRACT

A semiconductor device is provided which includes a semiconductor substrate having a first region and a second region, transistors having metal gates formed in the first region, and at least one capacitor formed in the second region. The capacitor includes a top electrode having at least one stopping structure formed in the top electrode, the at least one stopping structure being of a different material from the top electrode, a bottom electrode, and a dielectric layer interposed between the top electrode and the bottom electrode.

20 Claims, 15 Drawing Sheets

INTEGRATING A CAPACITOR IN A METAL GATE LAST PROCESS

PRIORITY DATA

This application claims priority to Provisional Application Ser. No. 61/078,149, filed on Jul. 3, 2008, entitled "INTEGRATING A CAPACITOR IN A METAL GATE LAST PROCESS," the entire disclosure of which is incorporated herein by reference.

BACKGROUND

The present disclosure relates generally to forming an integrated circuit device on a substrate and, more particularly, to integrating a capacitor in a metal gate last process.

Semiconductor device geometries continue to dramatically decrease in size since such devices were first introduced several decades ago. Today's fabrication plants are routinely producing devices having feature dimensions less than 65 nm. However, solving the problems associated with implementing new process and equipment technology while continuing to satisfy device requirements has become more challenging. For example, metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning is completed.

In some IC designs, there has been a desire to replace the polysilicon gate electrode with a metal gate electrode to improve device performance as feature sizes continue to decrease. A gate last process may be implemented to address the concerns of high temperature processing on metal materials. In the gate last process, the metal gate structure may be formed after formation of the source/drain structures. However, problems arise when integrating the gate last process with other fabrication technologies such as a capacitor layout.

Therefore, what is needed is a device and method for integrating a capacitor in a gate last process.

SUMMARY

In one embodiment, a semiconductor device is provided which includes a semiconductor substrate having a first region and a second region, a plurality of transistors having metal gates formed in the first region, at least one capacitor formed in the second region that includes a top electrode having at least one stopping structure formed therein, the at least one stopping structure being of a different material from the top electrode, a bottom electrode, and a dielectric layer interposed between the top electrode and the bottom electrode.

In another embodiment, a method of fabricating a semiconductor is provided which includes providing a semiconductor substrate having a first region and a second region, forming a plurality of transistors having metal gates in the first region, and forming at least one capacitor in the second region. The step of forming the at least one capacitor includes forming a top electrode having at least one stopping structure formed therein, the at least one stopping structure being of a different material from the top electrode, forming a bottom electrode; and forming a dielectric layer interposed between the top electrode and the bottom electrode.

DETAILED DESCRIPTION

Figure 1:
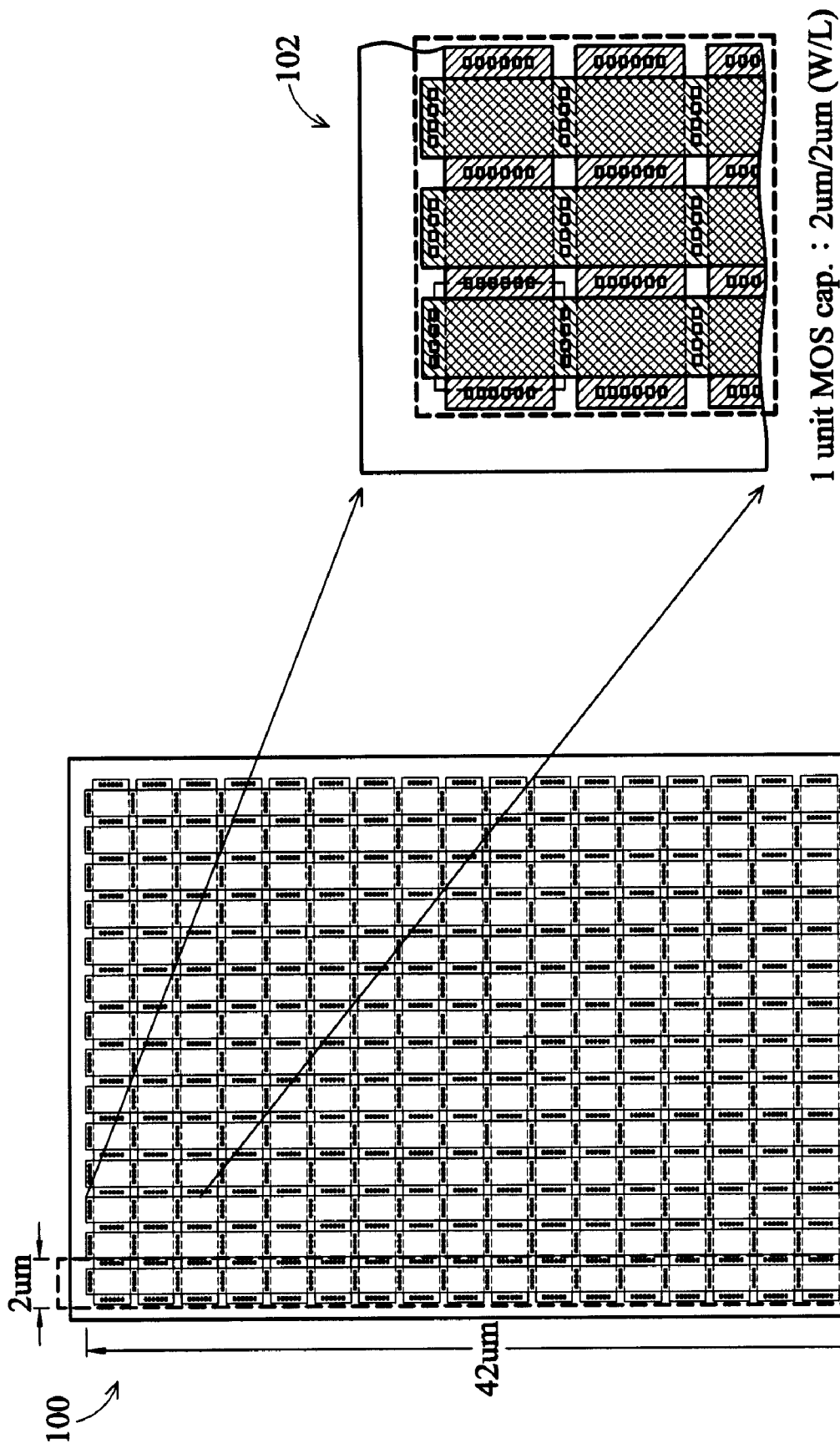
FIG. 1 is a top view of a graphical representation of a MOS capacitor layout.

The present disclosure relates generally to forming an integrated circuit device on a substrate and, more particularly, to fabricating a decoupling capacitor as part of an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a top view of a graphical representation of a decoupling capacitor (DECAP) layout 100 with a one unit MOS capacitor 102 having a 2 um×2 um dimension (width×length). The total dimension of the polysilicon (poly) pattern array may include a 2 um×42 um poly (that may violate a pattern density rule 80% of 900 um$^2$). Accordingly, a chemical mechanical polishing (CMP) process may cause poly/aluminum (Al) dishing when there is a violation of the pattern density rule.

Figure 2B:
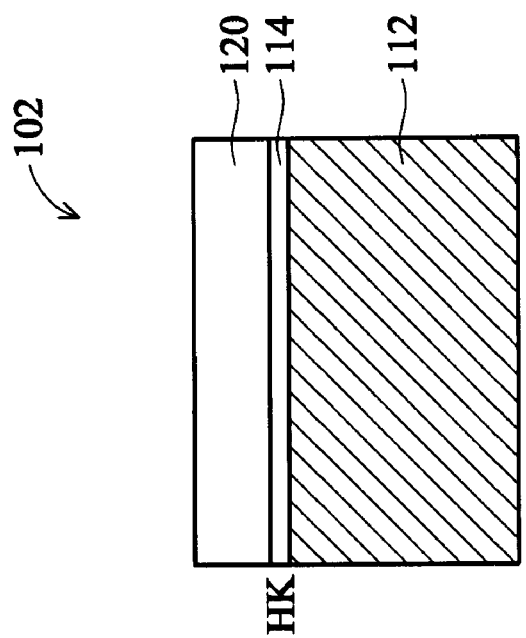
FIGS. 2A and 2B are top and cross-sectional views, respectively, of one unit of the MOS capacitor layout of FIG. 1.
Figure 2A:
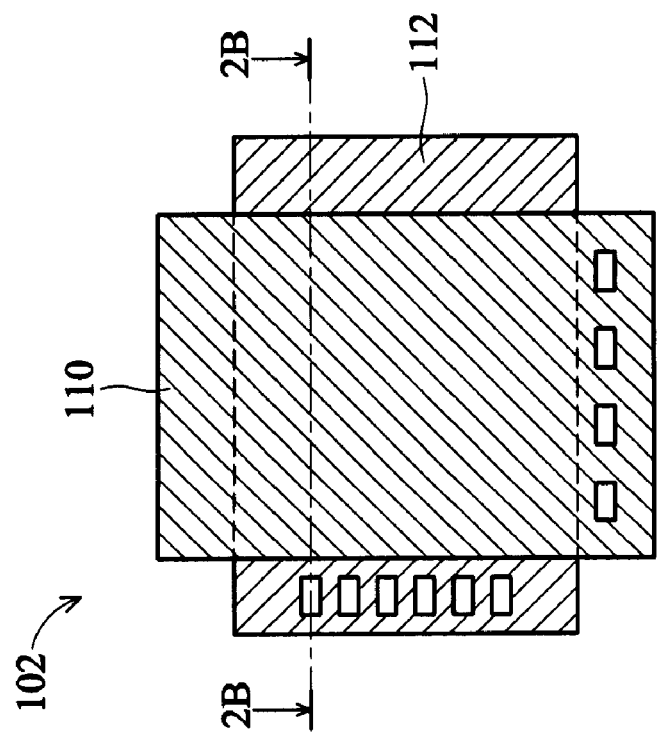

Referring to FIGS. 2A and 2B, illustrated are top and cross sectional views, respectively, of one unit of the MOS capacitor layout 102 of FIG. 1. In FIG. 2A, the MOS capacitor 102 may initially include a poly film 110 for a top electrode. The poly film 110 may be formed by conventional MOS technology processing such as polysilicon deposition, photolithography, etching, and other suitable methods. The capacitor 102 may further include a silicon substrate 112 for a bottom electrode. Alternatively, the capacitor 102 may include a silicide structure formed in the substrate 112 for the bottom electrode. In FIG. 2B, the capacitor 102 may include a high k (HK) dielectric 114 such as hafnium oxide (HfO$_2$) interposed between the top electrode and the bottom electrode. Alternatively, the HK dielectric 114 may include materials such as, but not limited to, hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. In a gate last process, the poly film 110 may be removed by an etching process, and may be replaced with a metal 120 such as AL for the top electrode as will be explained in detail below.

Figure 3A:
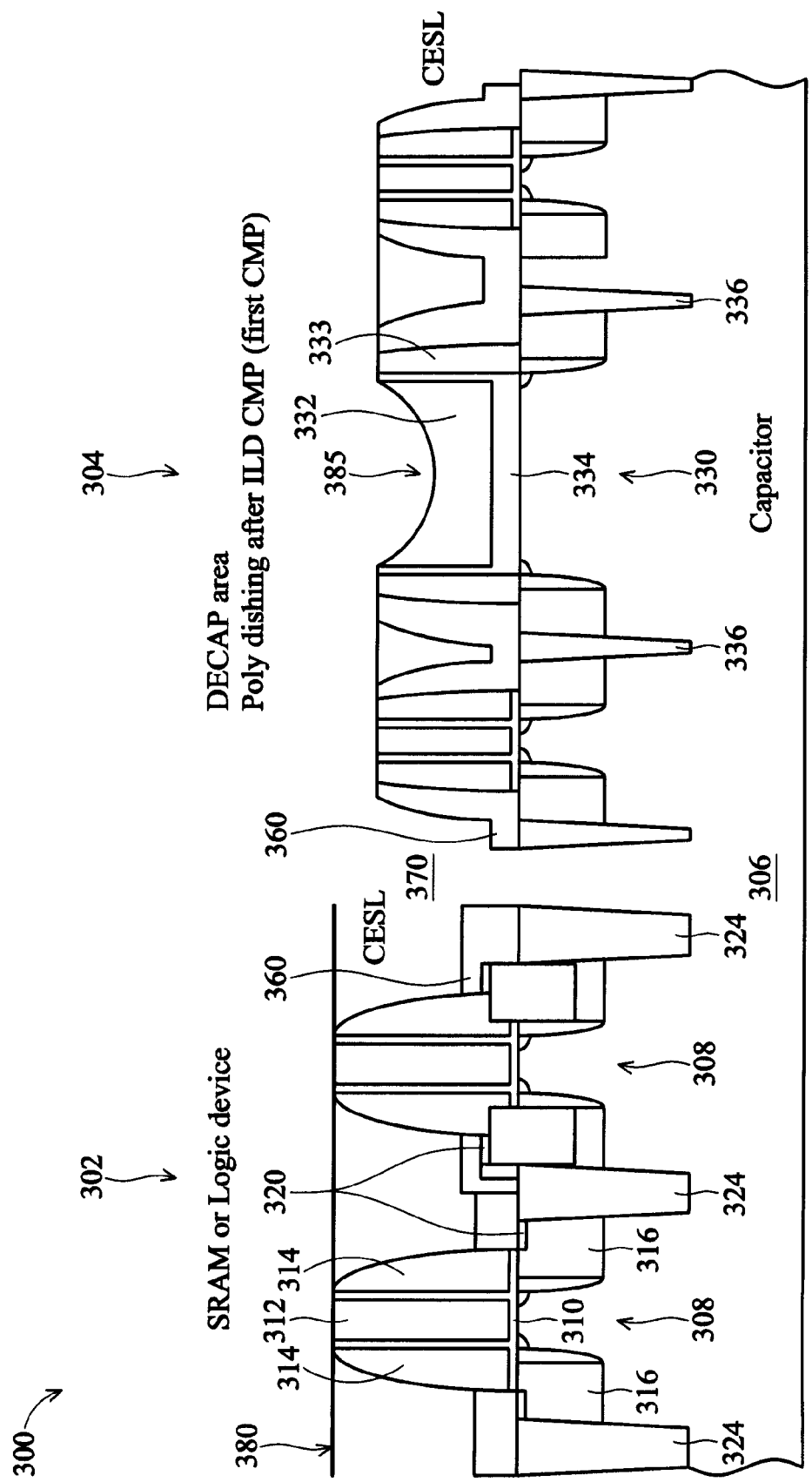
FIGS. 3A-3C are cross sectional vies of a semiconductor device including the MOS capacitor of FIGS. 1 and 2 at various stages of fabrication in a gate last process.
Figure 3B:
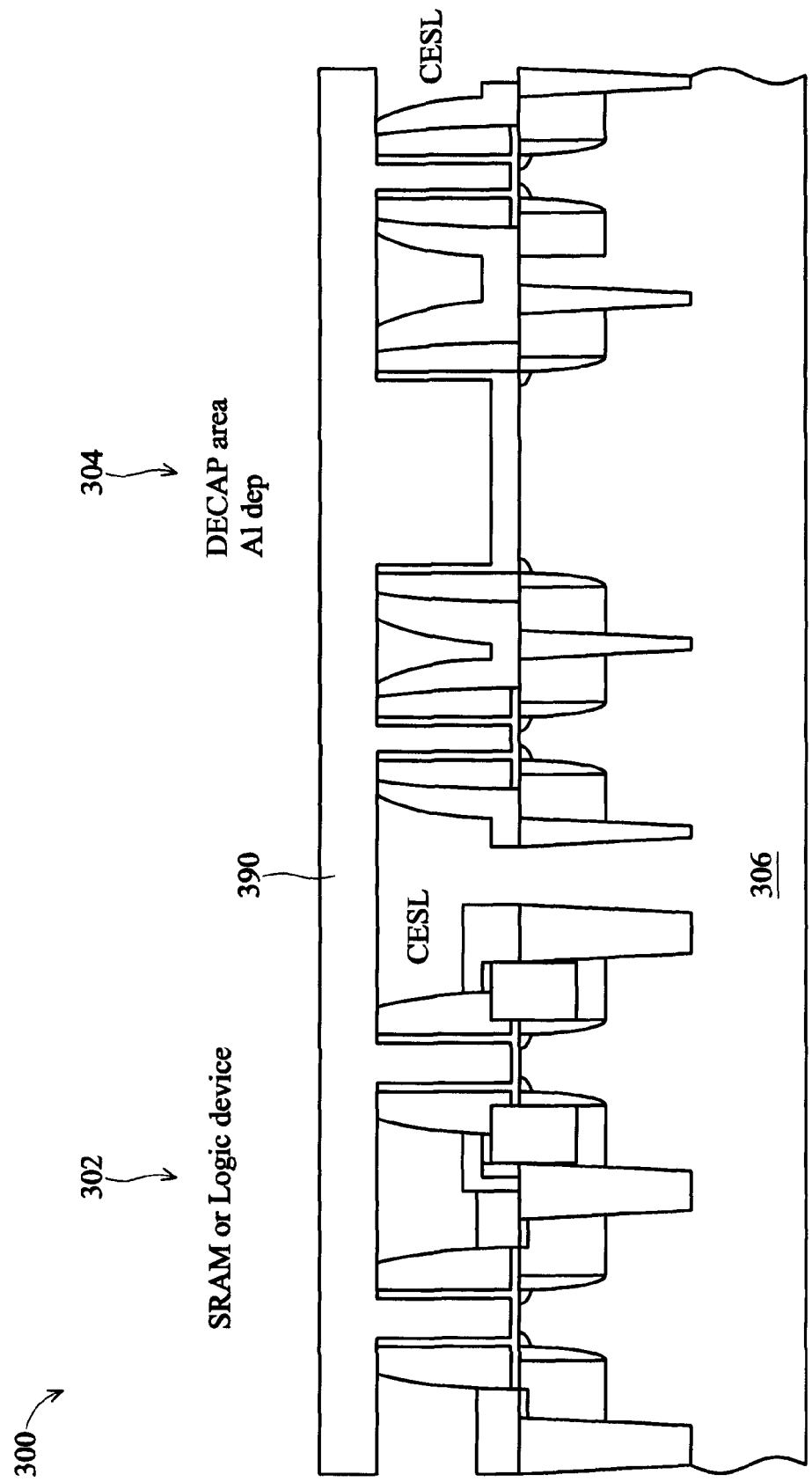
Figure 3C:
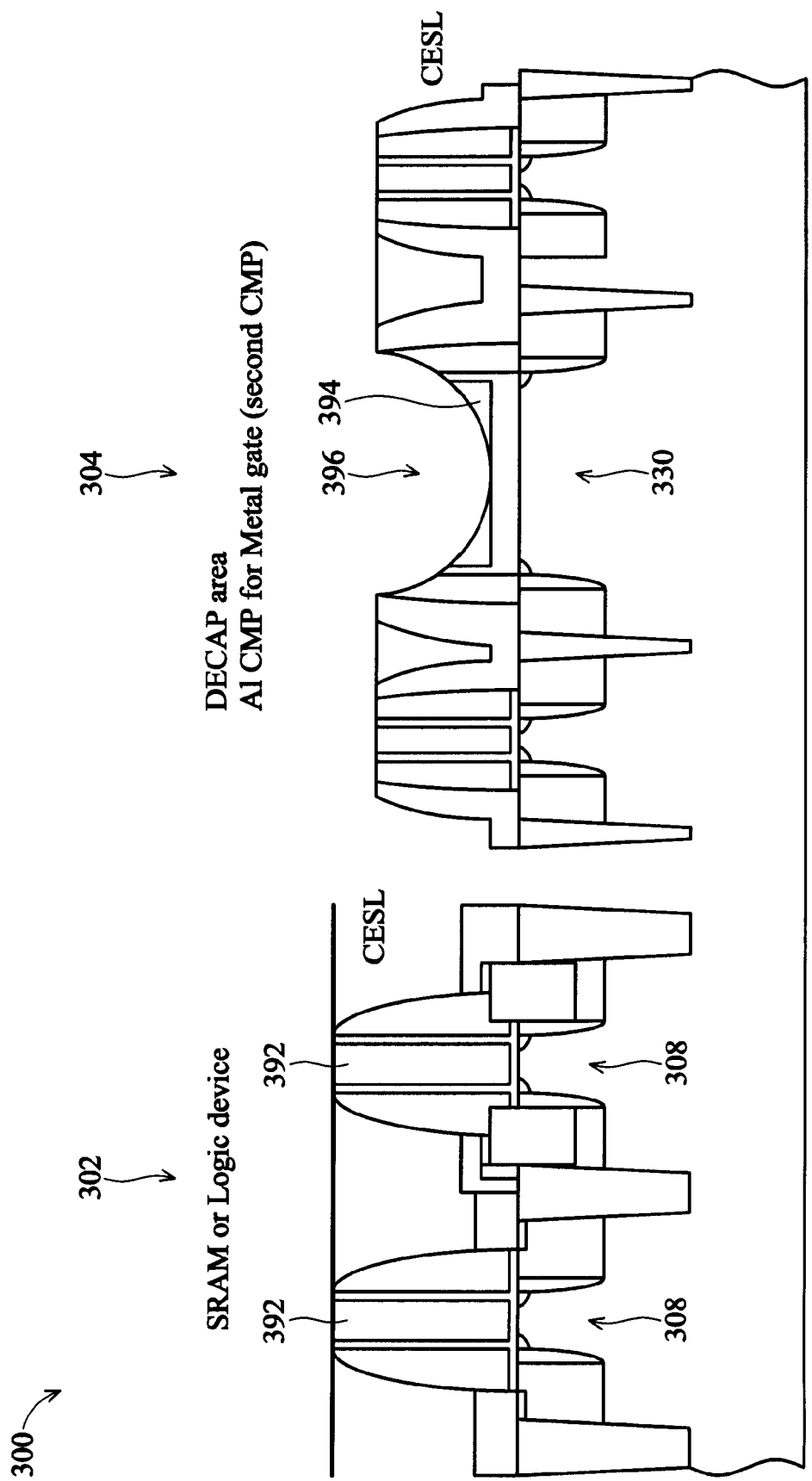

Referring to FIGS. 3A-3C, illustrated are cross sectional views of a semiconductor device 300 at an intermediate stage of fabrication in a gate last process. In the present example, the semiconductor device 300 may include regions 302 and 304 in which various active and passive microelectronic devices may be formed as part of an integrated circuit (IC). For example, the IC may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 300 may include a semiconductor substrate 306 such as a silicon substrate. The substrate 306 may include various doping configurations depending on design requirements as is known in the art. The substrate 306 may also include other elementary semiconductors such as germanium and diamond. Alternatively, the substrate 306 may include a compound semiconductor and/or an alloy semiconductor. Further, the substrate 106 may optionally include an epitaxial layer (epi layer), may be strained for performance enhancement, and may include a silicon-on-insulator (SOI) structure.

The region 302 may include a plurality of transistors 308 such as FETs. The transistors 308 may be configured as P-channel or N-channel as is known in the art. The transistors 308 may include a gate dielectric 310 and dummy poly gate structure 312. The gate dielectric 310 may include a high k dielectric material such as hafnium oxide (HfO$_2$). Alternatively, the gate dielectric 310 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The dummy poly gate structure 312 may be formed of polysilicon (or poly). The transistors 308 may include spacers 314 located on both sidewalls of the gate structure. The spacers 314 may be formed of silicon oxide, silicon nitride, silicon oxynitride, fluoride-doped silicate glass (FSG), or a low k dielectric material.

The transistors 308 may further include source/drain regions 316 including lightly doped source/drain regions and heavy doped source/drain regions. The source/drain regions 316 may be formed by implanting p-type or n-type dopants or impurities into the substrate 306 depending on the configuration of the transistors 308. The transistors 308 may further include silicide features 320 formed on the source/drain regions 316 by a salicide (self-aligned silicide) process to form a contact. The silicide features 320 may include nickel silicide, cobalt silicide, tungsten silicide, tantalum silicide, titanium silicide, platinum silicide, erbium silicide, palladium silicide, or combinations thereof. The transistors 308 may be isolated from each other by a plurality of isolation structures 324 such as shallow trench isolation (STI) features formed in the substrate 306. The isolation structures 324 may include silicon oxide, silicon nitride, silicon oxynitride, fluoride-doped silicate glass (FSG), and/or a low k dielectric material.

The process of forming transistors 308 may be performed by conventional MOS technology processing. For example, the dummy poly gate structures 312 and source/drain structures 316 may be formed by methods including thermal oxidation, polysilicon deposition, photolithography, ion implantation, etching, and various other methods known in the art.

The region 304 may include a DECAP 330 similar to the MOS capacitor 102 of FIGS. 1 and 2. It is understood that other microelectronic devices such as transistors may be formed near the DECAP 330. The process of forming the DECAP 330 in region 304 may be performed in the same process that forms the transistors 308 in region 302. The DECAP 330 may include a poly gate structure 332 for a top electrode. The poly gate structure 332 may be formed of polysilicon. Spacers 333 may be formed on the sidewalls of the poly gate structure 332. The spacers 333 may be formed of silicon oxide, silicon nitride, silicon oxynitride, fluoride-doped silicate glass (FSG), or a low k dielectric material.

The DECAP 330 may include a bottom electrode that is formed by the substrate 306. Alternatively, the bottom electrode may optionally include a silicide structure formed in the substrate 306. The DECAP 330 may further include a high k dielectric 334 such as hafnium oxide (HfO$_2$) interposed between the top electrode (poly gate structure 332) and the bottom electrode (the substrate 306). The high k dielectric 334 may be formed of substantially the same material as the gate dielectric 310 of transistors 308. Alternatively, the high k dielectric 334 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The DECAP 330 may be isolated from other devices by a plurality of isolation structures 336 such as shallow trench isolation (STI) features formed in the substrate 306. The isolation structures 336 may include silicon oxide, silicon nitride, silicon oxynitride, fluoride-doped silicate glass (FSG), and/or a low k dielectric material.

After formation of the various microelectronic devices and features in the substrate 306, a stressed layer such as a contact etch stop layer (CESL) 360 may be formed overlying the regions 302 and 304. The CESL 360 may be formed of silicon nitride, silicon oxynitride, and/or other suitable materials. A dielectric layer such as an inter-layer (or level) dielectric (ILD) layer 370 may be formed overlying the CESL 360 by chemical vapor deposition (CVD), high density plasma CVD, spin-on, sputtering, or other suitable methods. The ILD layer 370 may include silicon oxide, silicon oxynitride, or a low k material. In a gate last process, the dummy poly gate structures 312 of transistors 308 may be removed so that true metal gate structures may be formed in place of the dummy poly gate structures 312. Accordingly, the ILD layer 370 may be planarized by a chemical mechanical polishing (CMP) process 380 (e.g., first CMP process) until at a top portion of the dummy poly gate structures 312 is reached.

However, it has been observed that following the ILD CMP process there may be some over-polishing (or dishing effect) 385 on the top electrode (the poly gate structure 332) of the DECAP 330 in region 304. The over-polishing or dishing effect 385 may be caused by the different pattern structures and pattern densities in region 302 as compared to region 304 (e.g., violation of pattern density rules as was discussed in FIG. 1).

In FIG. 3B, the dummy poly gate structures 312 of transistors 308 and the poly gate structure 332 of DECAP 330 may be removed by an etching process that selectively etches the polysilicon as is known in the art. Thereafter, a metal material layer 390 such as Al may be formed over the substrate 306 filling in the openings that were created by the removal of the dummy poly gate structures 312 in region 302 and poly gate structure 332 in region 304.

In FIG. 3C, the metal material layer 390 may undergo a CMP process (e.g., second CMP) to remove a portion of the metal layer, and form metal gates 392 for transistors 308 in region 302 and a top metal electrode 394 for the DECAP 330 in region 304. However, it has been observed that following the Al CMP process there may be some over-polishing (or dishing effect) 396 on the top metal electrode 394 of the DECAP 330 in region 304. The over-polishing or dishing effect 396 may be caused by the different pattern structures and pattern densities in region 302 as compared to region 304 (e.g., violation of pattern density rules as was discussed in FIG. 1). Thus, the over-polishing may remove a portion of the top metal electrode 394 which can lead to unpredictable device performance and in some cases capacitor failure.

Figures 4A, 4B:
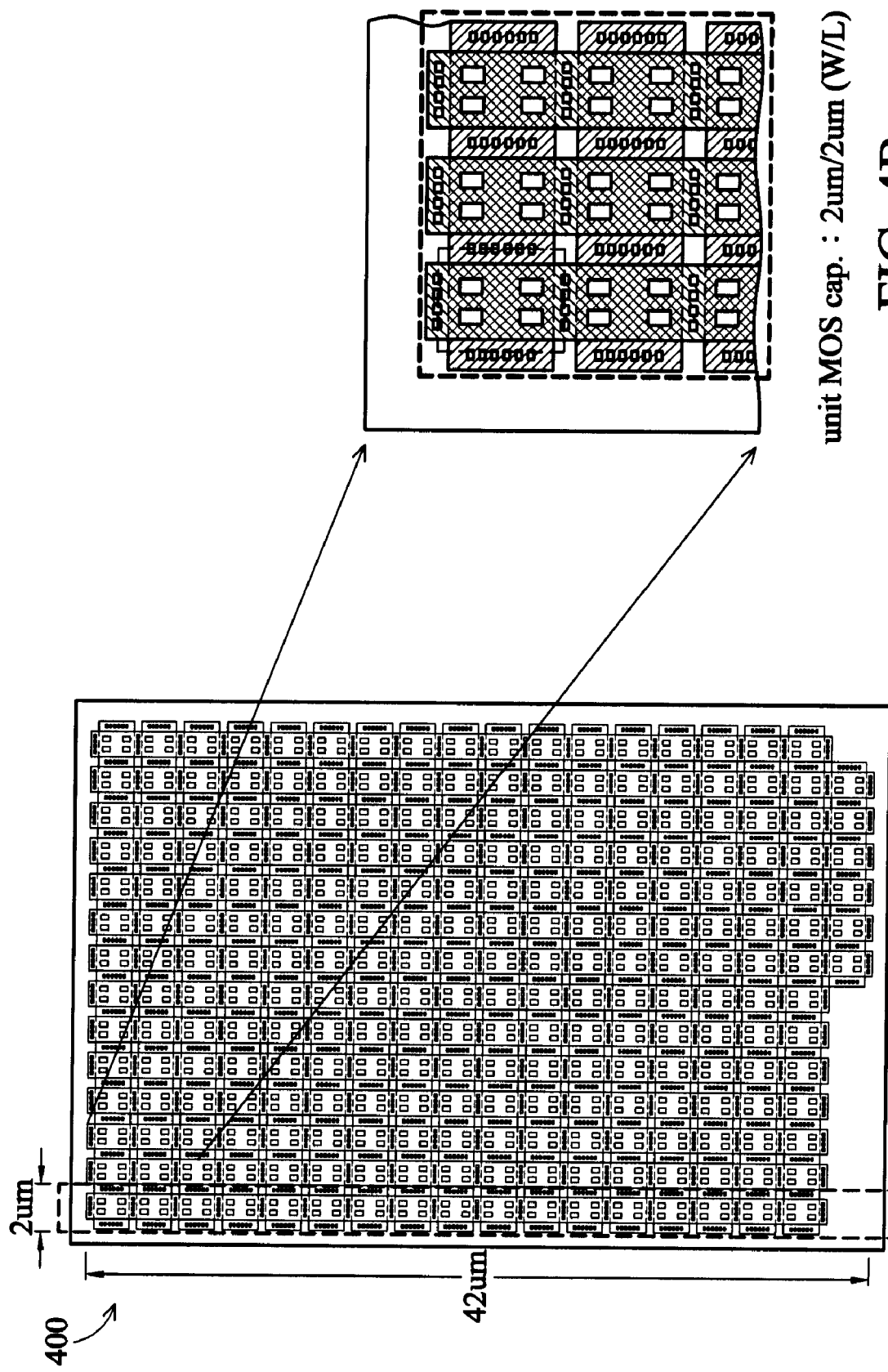
FIGS. 4A-4C are top views of a MOS capacitor layout having a stopping structure according to various aspects of the present disclosure.
Figure 4C:
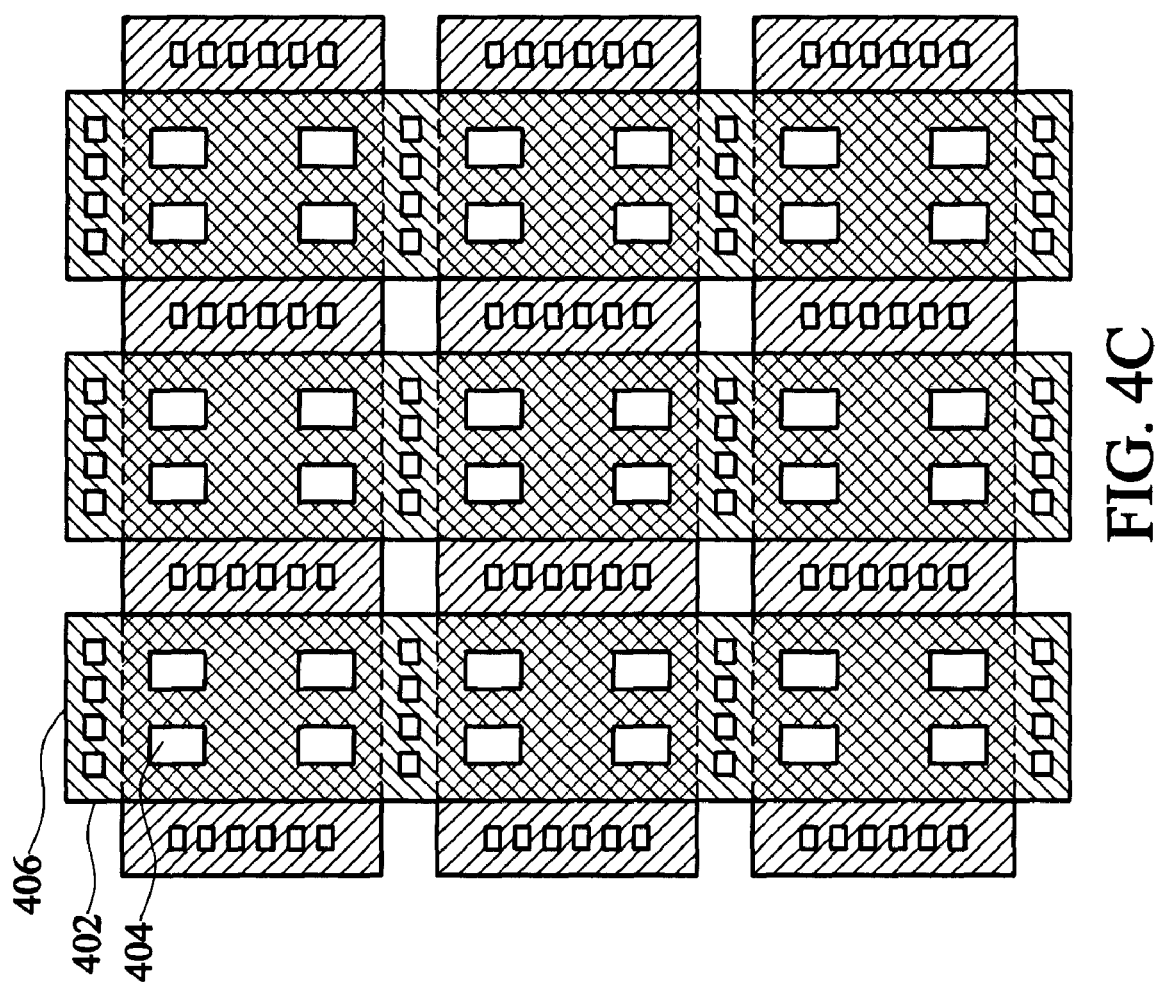

Referring now to FIGS. 4A-4C, illustrated are top views of a DECAP layout 400 with a one unit MOS capacitor 402 having a 2 um×2 um dimension (width×length). The total dimension of the polysilicon (poly) pattern array may include a 2 um×42 um poly pattern. The MOS capacitor 402 may include a plurality of polishing stopping structures 404 formed in the poly film 406 which makes up a top electrode of the capacitor 402. The polishing stopping structures 404 may prevent or reduce the risk of over-polishing (or dishing) on the top electrode of the capacitor 402 in a gate last process as will be explained in detail below. The formation of the polishing stopping structures 404 are performed in the same process that forms the dummy poly gate structures of the transistors as will be explained in detail below. Accordingly, the formation of the polishing stopping structures 404 does not involve additional processing steps (no additional costs), and also does not add complexity to the processing steps already in use.

Figure 5B:
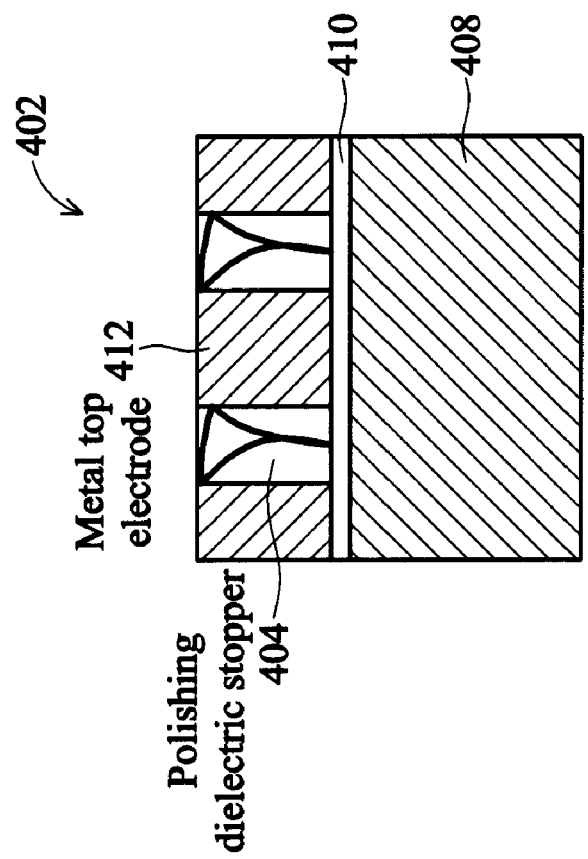
FIGS. 5A and 5B are top and cross-sectional views, respectively, of one unit of the MOS capacitor layout of FIG. 4.
Figure 5A:
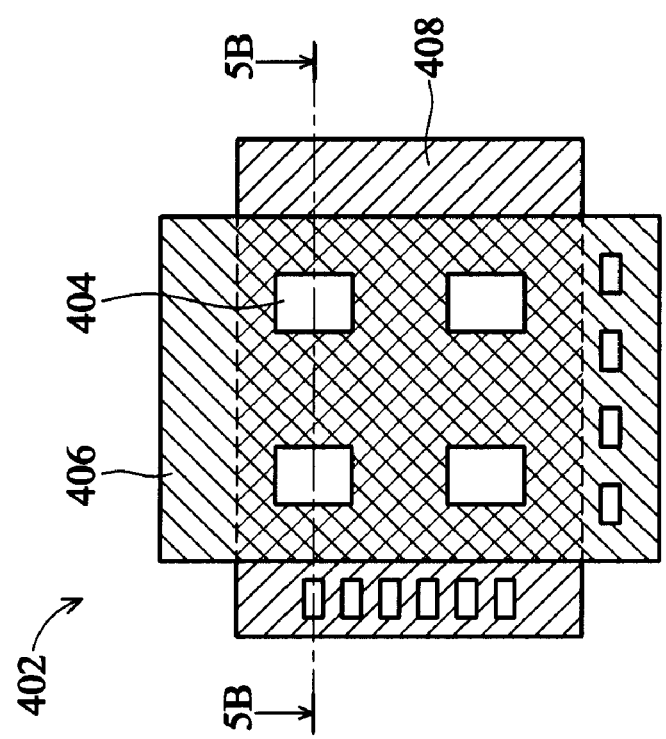

Referring now to FIGS. 5A and 5B, illustrated are top and cross sectional views, respectively, of the MOS capacitor layout 402 of FIG. 4. In FIG. 5A, the MOS capacitor 402 may initially include the poly film 406 for a top electrode. The poly film 406 may be formed by conventional MOS technology processing such as polysilicon deposition, photolithography, etching, and other suitable methods. The capacitor 402 may include polishing stopping structures (pillar-type structures) 404 formed in the poly film 406. The polishing stopping structures 404 may be formed of the same dielectric materials as the spacers of transistors as will be explained in detail below. The capacitor 402 may further include a silicon substrate 408 for a bottom electrode. Alternatively, the capacitor 402 may optionally include a silicide structure formed in the substrate 408 for the bottom electrode.

In FIG. 5B, the capacitor 102 may include a high k (HK) dielectric 410 such as hafnium oxide ($HfO_2$) interposed between the top electrode and the bottom electrode. Alternatively, the HK dielectric 410 may include materials such as, but not limited to, hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. In a gate last process, the poly film 406 may be removed by an etching process that selectively etches the polysilicon, and may be replaced with a metal 412 such as AL for the top electrode as will be explained in detail below. It is understood that other suitable metal materials may be used for the top electrode.

Figure 6:
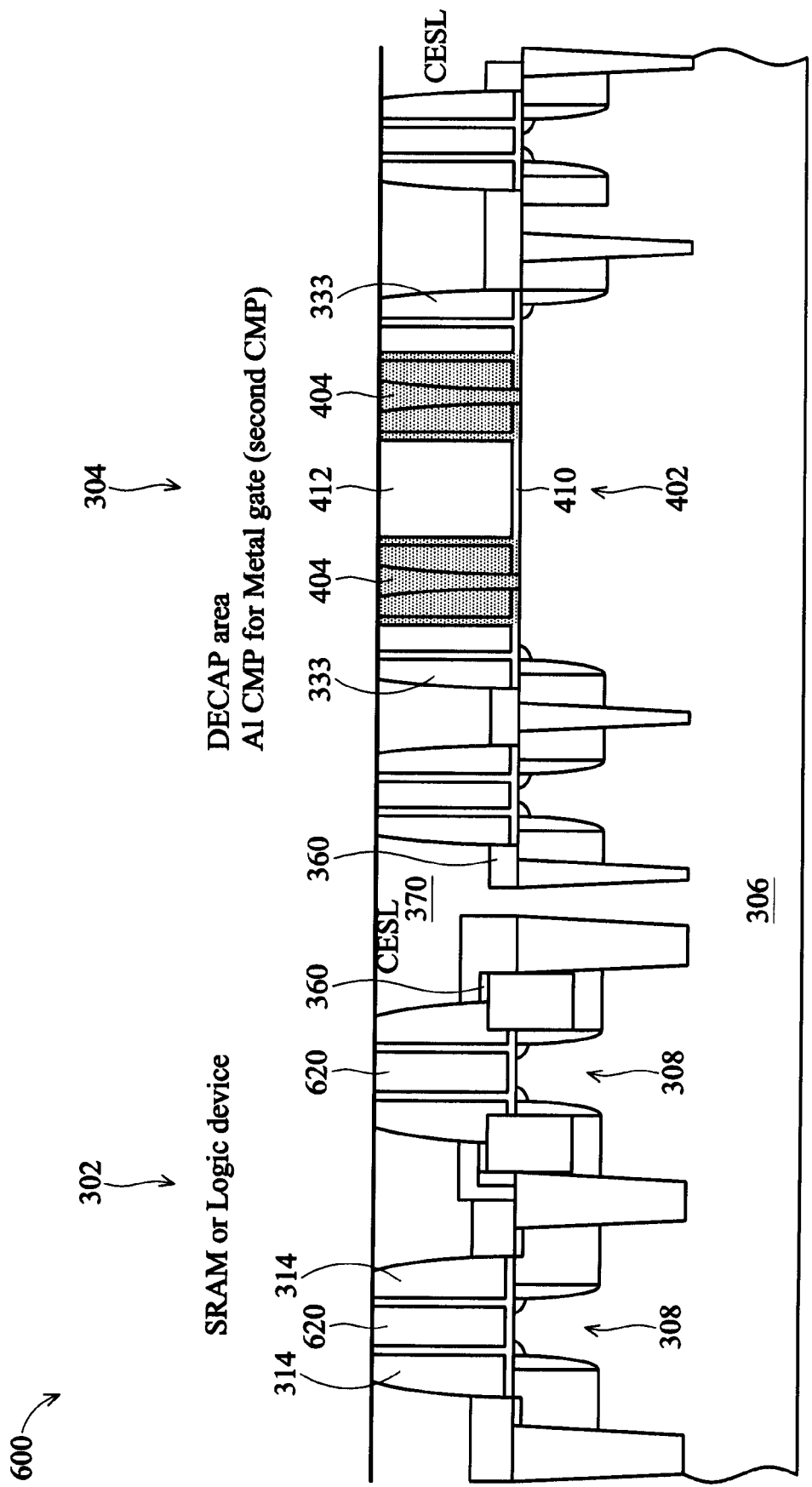
FIG. 6 is a cross sectional view of a semiconductor device including the capacitor of FIGS. 4 and 5 at an intermediate stage of fabrication in a gate last process.

Referring now to FIG. 6, illustrated is a cross sectional view of a semiconductor device 600 including the MOS capacitor 402 of FIGS. 4 and 5 at an intermediate stage of fabrication in a gate last process. The semiconductor device 600 is similar to the semiconductor device 300 of FIG. 3 except that the DECAP 330 in region 304 is replaced with the capacitor 402 of FIGS. 4 and 5. Similar features in FIGS. 3 and 6 are numbered the same for the sake of clarity. In the present example, the semiconductor device 600 may include regions 302 and 304 in which various active and passive microelectronic devices may be formed as part of an integrated circuit (IC). For example, the IC may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 600 may include a semiconductor substrate 306 such as a silicon substrate. The substrate 306 may include various doping configurations depending on design requirements as is known in the art. The substrate 306 may also include other elementary semiconductors such as germanium and diamond. Alternatively, the substrate 306 may include a compound semiconductor and/or an alloy semiconductor. Further, the substrate 106 may optionally include an epitaxial layer (epi layer), may be strained for performance enhancement, and may include a silicon-on-insulator (SOI) structure.

The region 302 may include a plurality of transistors 308 such as FETs. The transistors 308 may be configured as P-channel or N-channel as is known in the art. The transistors 308 may initially be formed with dummy poly gate structures (not shown) that are subsequently removed and replaced with true metal gate structures 620. The transistors 308 may include a gate dielectric formed of a high k dielectric material such as hafnium oxide ($HfO_2$). Alternatively, the gate dielectric may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The transistors 308 may further include spacers 314 located on both sidewalls of the gate structure. The spacers 314 may be formed of silicon oxide, silicon nitride, silicon oxynitride, fluoride-doped silicate glass (FSG), or a low k dielectric material.

The transistors 308 may further include source/drain regions including lightly doped source/drain regions and heavy doped source/drain regions. The source/drain regions may be formed by implanting p-type or n-type dopants or impurities into the substrate 306 depending on the configuration of the transistors 308. The transistors 308 may further include silicide features formed on the source/drain regions by a salicide (self-aligned silicide) process to form a contact. The silicide features may include nickel silicide, cobalt silicide, tungsten silicide, tantalum silicide, titanium silicide, platinum silicide, erbium silicide, palladium silicide, or combinations thereof. The transistors 308 may be isolated from each other by a plurality of isolation structures such as shallow trench isolation (STI) features formed in the substrate 306. The isolation structures may include silicon oxide, silicon nitride, silicon oxynitride, fluoride-doped silicate glass (FSG), and/or a low k dielectric material.

The process of forming transistors 308 may be performed by conventional semiconductor processing. For example, the dummy poly gate structures and source/drain structures may be formed by methods including thermal oxidation, polysilicon deposition, photolithography, ion implantation, etching, and various other methods known in the art.

The region 304 may include the MOS capacitor 402 of FIGS. 4 and 5 (for the DECAP). It is understood that other microelectronic devices such as transistors may be formed near the DECAP 402. The process of forming the DECAP 402 in region 304 may be performed in the same process that forms the transistors 308 in region 302. The DECAP 402 may initially include a poly gate structure (reference number 406 in FIGS. 4 and 5) for a top electrode. The poly gate structure may include the polishing stopping structures 404 formed therein. Spacers 333 may be formed on the sidewalls of the poly gate structure 332. The spacers 333 may be formed of silicon oxide, silicon nitride, silicon oxynitride, fluoride-doped silicate glass (FSG), or a low k dielectric material.

The polishing stopping structures 404 may be formed by the same process that forms the dummy poly gate structures of transistors 308 including the spacers 314 in region 102. Accordingly, the polishing stopping structures 404 have substantially the same material as the spacers 314 in region 302, and the spacers 333 in region 304. For example, in forming the dummy poly gate structures and spacers of transistors 308, and the poly gate structure and polishing stopping structures 404 of DECAP 402, a polysilicon layer may be formed over regions 302 and 304. A photoresist layer may then be formed over the polysilicon layer, and may be patterned (e.g., photolithography) using a photomask to form a patterned poly gate feature in region 302 (for transistors 308). The same photomask may also include a patterned poly gate feature having holes (shown in FIGS. 4 and 5) in region 304 (for the DECAP 402). The shape of the holes may include a rectangular shape (shown in FIGS. 4 and 5), a square shape, an ellipse shape, a circular shape, or other suitable shape. The amount of holes and position of the holes in the patterned poly gate feature may vary depending on design requirements of the semiconductor device. For example, the polishing stopping structures 404 may cover at least 5% of the pattern density in region 304. Also, a size of the polishing stopping structures 404 is substantially not less than a size of the gate of the transistors 308.

The pattern of the photoresist layer may then be transferred to the underlying polysilicon layer by a dry etching process to form the dummy poly gate structures for transistors 308 and the poly gate structure with holes for the DECAP 402. In some embodiments, the patterned photoresist layer may be formed on a hard mask layer and then transferred to the polysilicon layer. The spacers 314 and 333 are formed by forming a dielectric layer such as silicon dioxide, silicon nitride, or silicon oxynitride over the dummy poly gate structures of transistor 308 and the poly gate structure with holes of the DECAP 402. The dielectric material will fill in the holes to form the polishing stopping structure 404 in the poly gate structure of DECAP 402. An anisotropic etching of the dielectric layer is performed leaving the spacers 314 on the sidewalls of the dummy poly gate structures of transistors 308, spacers 333 on the sidewalls of the poly gate structure of the DECAP, and the polishing stopping structure 404. Accordingly, the formation of the polishing stopping structures 404 does not involve additional processing steps (no additional costs), and also does not add complexity to the processing steps already in use.

The DECAP 402 may include a bottom electrode that is formed by the substrate 306. Alternatively, the bottom electrode may include a silicide structure formed in the substrate 306. The DECAP 402 may further include a high k dielectric 410 such as hafnium oxide ($HfO_2$) interposed between the top electrode and the bottom electrode. Alternatively, the high k dielectric 412 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

After formation of the various microelectronic devices and features in the substrate 306, a stressed layer such as a contact etch stop layer (CESL) 360 may be formed overlying the regions 302 and 304. The CESL 360 may be formed of silicon nitride, silicon oxynitride, and/or other suitable materials. A dielectric layer such as an inter-layer (or level) dielectric (ILD) layer 370 may be formed overlying the CESL 360 by chemical vapor deposition (CVD), high density plasma CVD, spin-on, sputtering, or other suitable methods. The ILD layer 370 may include silicon oxide, silicon oxynitride, or a low k material. In the gate last process, the dummy poly gate structures of transistors 308 and the poly gate structure of DECAP 402 may be removed so that metal gate structures may be formed to replace them.

Accordingly, the ILD layer 370 may be planarized by a chemical mechanical polishing (CMP) process 380 (e.g., first CMP process) until at a top portion of the dummy poly gate structures of transistors 308 is reached. Over-polishing or dishing on the poly gate structure of the DECAP 402 may be prevented or reduced by the polishing stopping structures 404. The dummy poly gate structures of transistors 308 and the poly gate structure of DECAP 402 may be removed by an etching process that selectively etches the polysilicon. The polishing stopping structures 404 are not removed following this etching process.

Thereafter, a metal material layer such as Al may be formed over the substrate 306 filling in the openings that were created by the removal of the dummy poly gate structures of transistors 308 in region 302 and poly gate structure of the DECAP 402 in region 304. It should be noted that other metal materials may be used such as aluminum alloys and the like. The metal material may surround the polishing stopping structures 404. The metal material layer may undergo a CMP process (e.g., second CMP) to remove a portion of the metal layer, and form metal gates 620 for transistors 308 in region 302 and a top metal electrode 412 for the DECAP 402 in region 304. The top metal electrode 412 may include the polishing stopping structures 404 formed therein. The polishing stopping structures 404 may help prevent or reduce the risk of over-polishing or dishing on the top metal electrode 412 by the metal CMP process. That is, the thickness of the top metal electrode of the DECAP 402 will be predictable, and thus device performance may be improved. Further, formation of the polishing stopping structures 404 does not involve additional processing steps and does not add complexity to the processing steps used to form the polishing stopping structures.

Figure 7A:
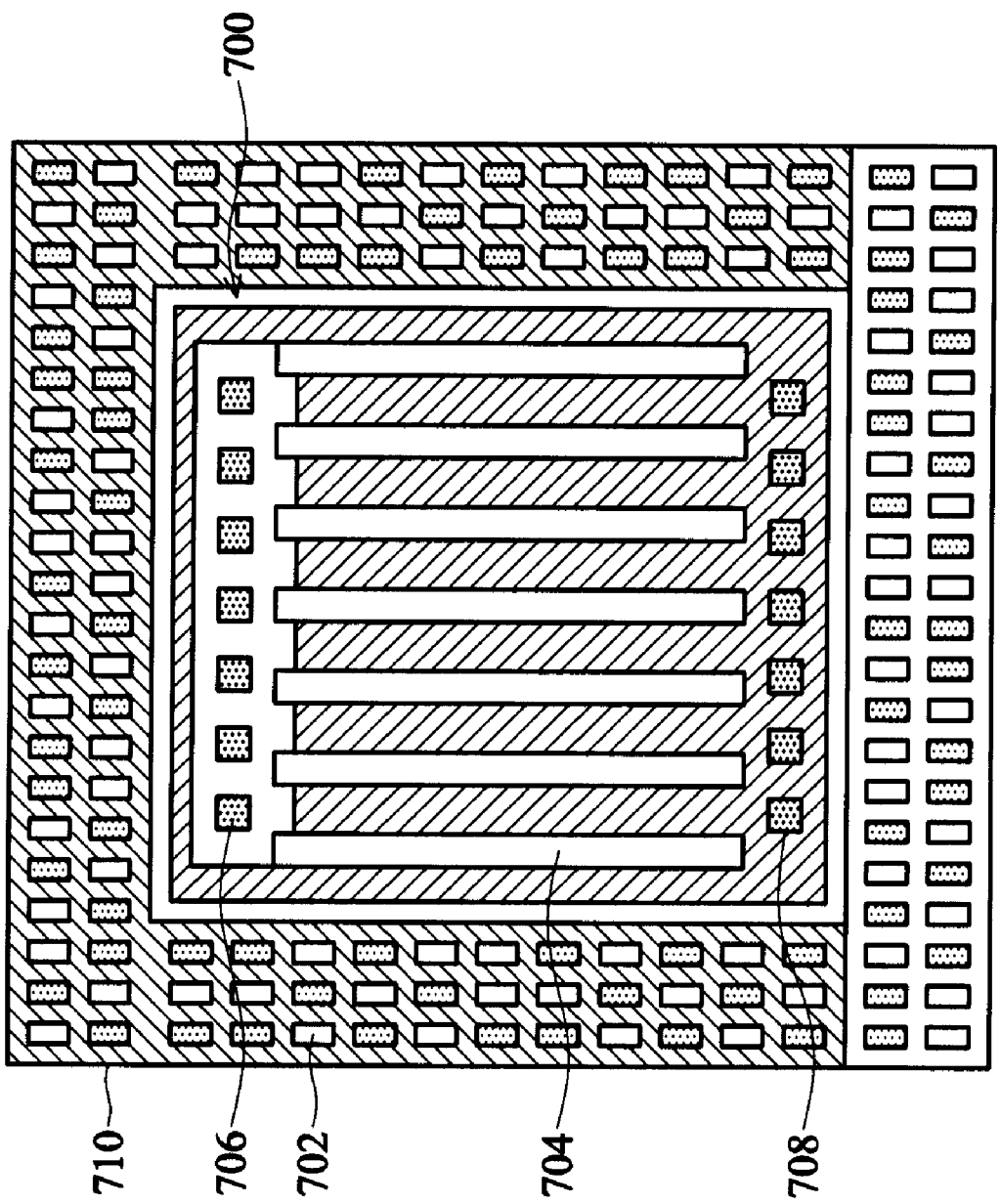
FIGS. 7A and 7B are top views of a capacitor array layout including a stopping structure according to various aspects of the present disclosure.
Figure 7B:
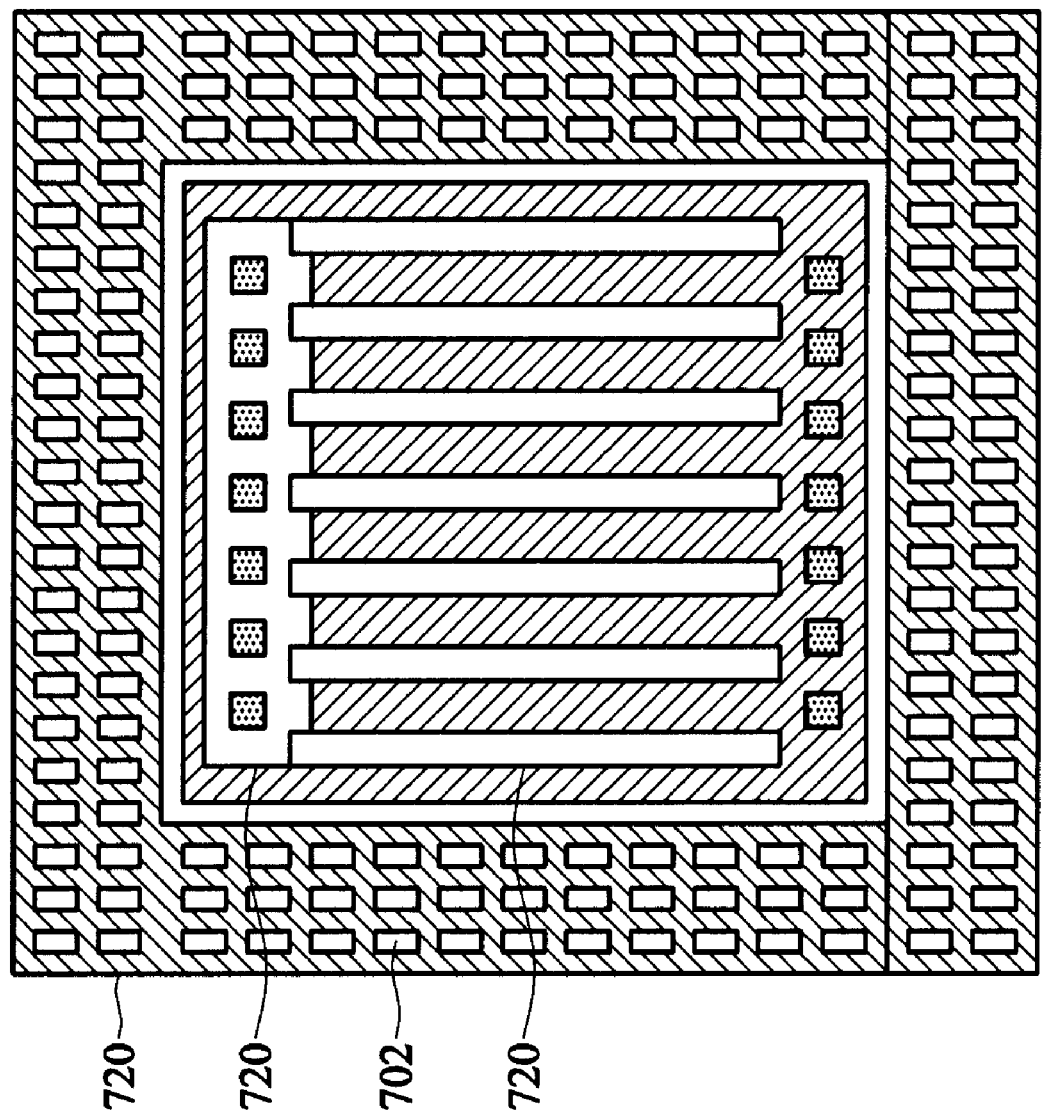

Referring now to FIGS. 7A and 7B, illustrated are top views of a capacitor array layout 700 with a polishing stopping structures 702 formed around the capacitor array. In FIG. 7A, the capacitor array 700 may include a plurality of capacitors each having a poly gate structure 704 for a top electrode that is coupled to a contact 706. Each capacitor in the array 700 may further include a contact 708 for a bottom electrode that may include a silicon substrate. Alternatively, the bottom electrode may include a silicide structure formed in the substrate. The capacitor array 700 may further include a high k dielectric (not shown) such as hafnium oxide ($HfO_2$) interposed between the top electrode and bottom electrode. Alternatively, the high k dielectric may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The polishing stopping structures 702 may be formed in a poly structure 710 that is located around the perimeter of the capacitor array 710 (outside of the capacitor array). The poly structure 710 and polishing stopping structures 702 may be formed in the same process that forms the poly gate structure 704 of the capacitor array 700 and dummy poly gate structure for transistors (not shown) similar to the process discussed in FIG. 6 (e.g., forming holes in the poly structure 710 and filling the holes with a dielectric material). Although, the polishing stopping structures 702 are illustrated as rectangular shapes, it is understood that the polishing stopping structures may have a square shape or other suitable shapes.

In FIG. 7B, the poly gate structure 704 for the top electrode and the poly structure 710 may be removed by an etching process that selectively removes the polysilicon (but leaves behind the polishing stopping structures 702), and may be replaced with a metal material 720 similar to the process that as was discussed in FIG. 6.

Figure 8A:
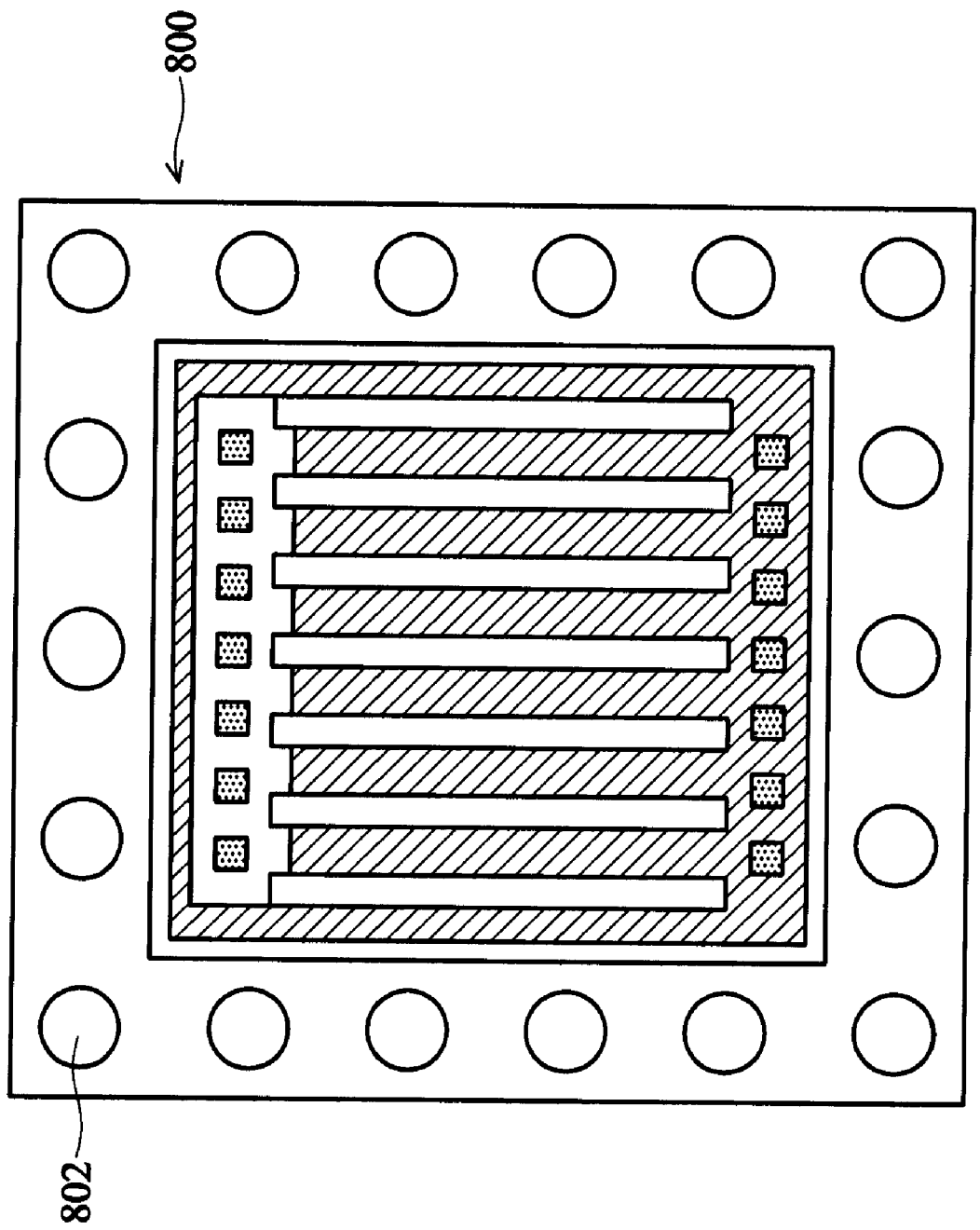
FIGS. 8A and 8B are top views of a capacitor array layout including an alternative stopping structure according to various aspects of the present disclosure.
Figure 8B:
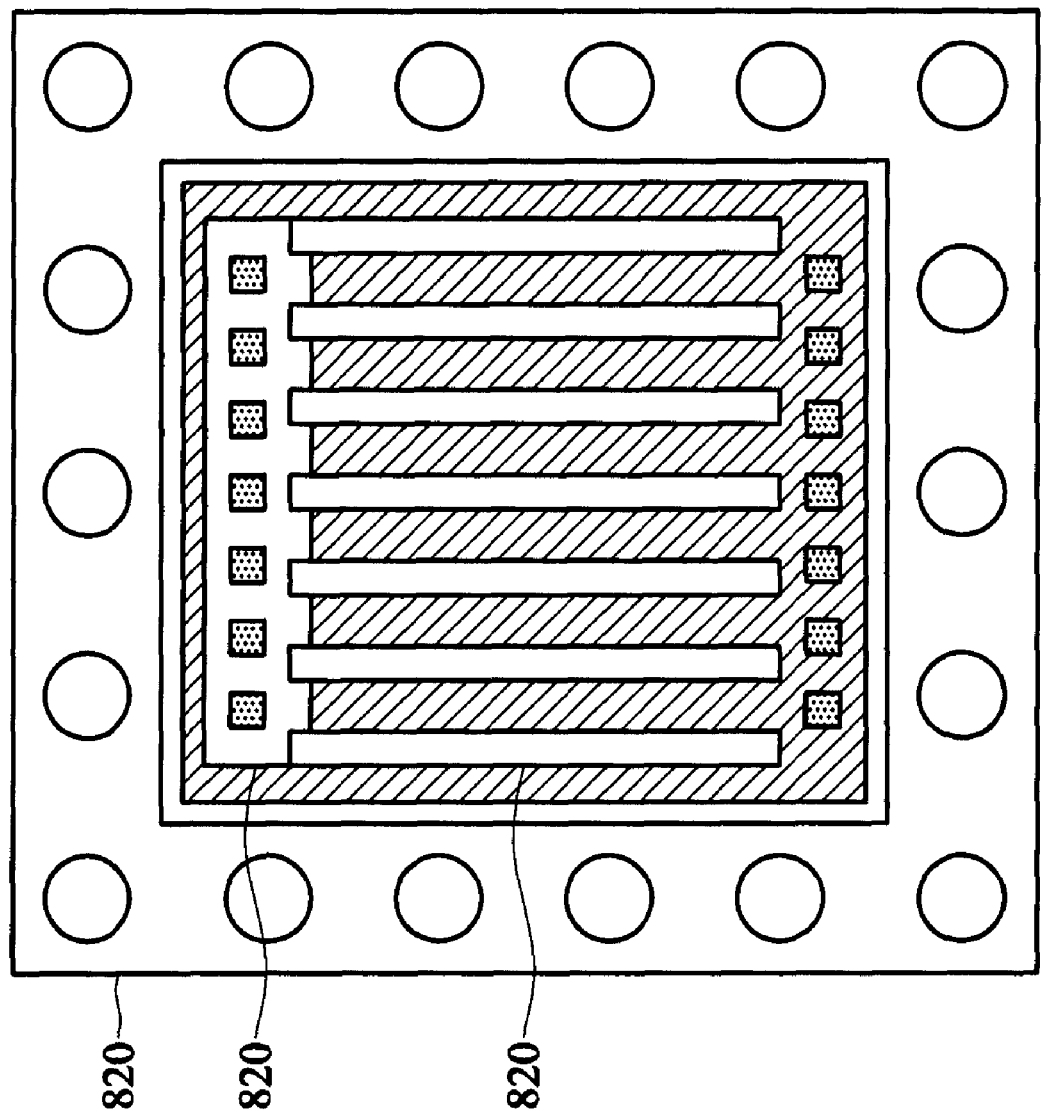

Referring now to FIGS. 8A and 8B, illustrated are top views of a capacitor array layout 800 with an alternative polishing stopping structure 802. The capacitor array layout 800 is similar to the capacitor layout 700 of FIG. 7 except for the shape and configuration of the polishing stopping structures 802. The polishing stopping structures 802 may include a circular shape instead of a rectangular shape. Alternatively, the polishing stopping structures 802 may optionally include an ellipse or oval shape. In FIG. 8B, the poly gate structure for the top electrode and the poly structure surrounding the polishing stopping structures 802 may be removed by an etching process that selectively removes the polysilicon (but leaves behind the polishing stopping structures 802), and may be replaced with a metal material 820 similar to the process that as was discussed in FIG. 6.

Figure 9:
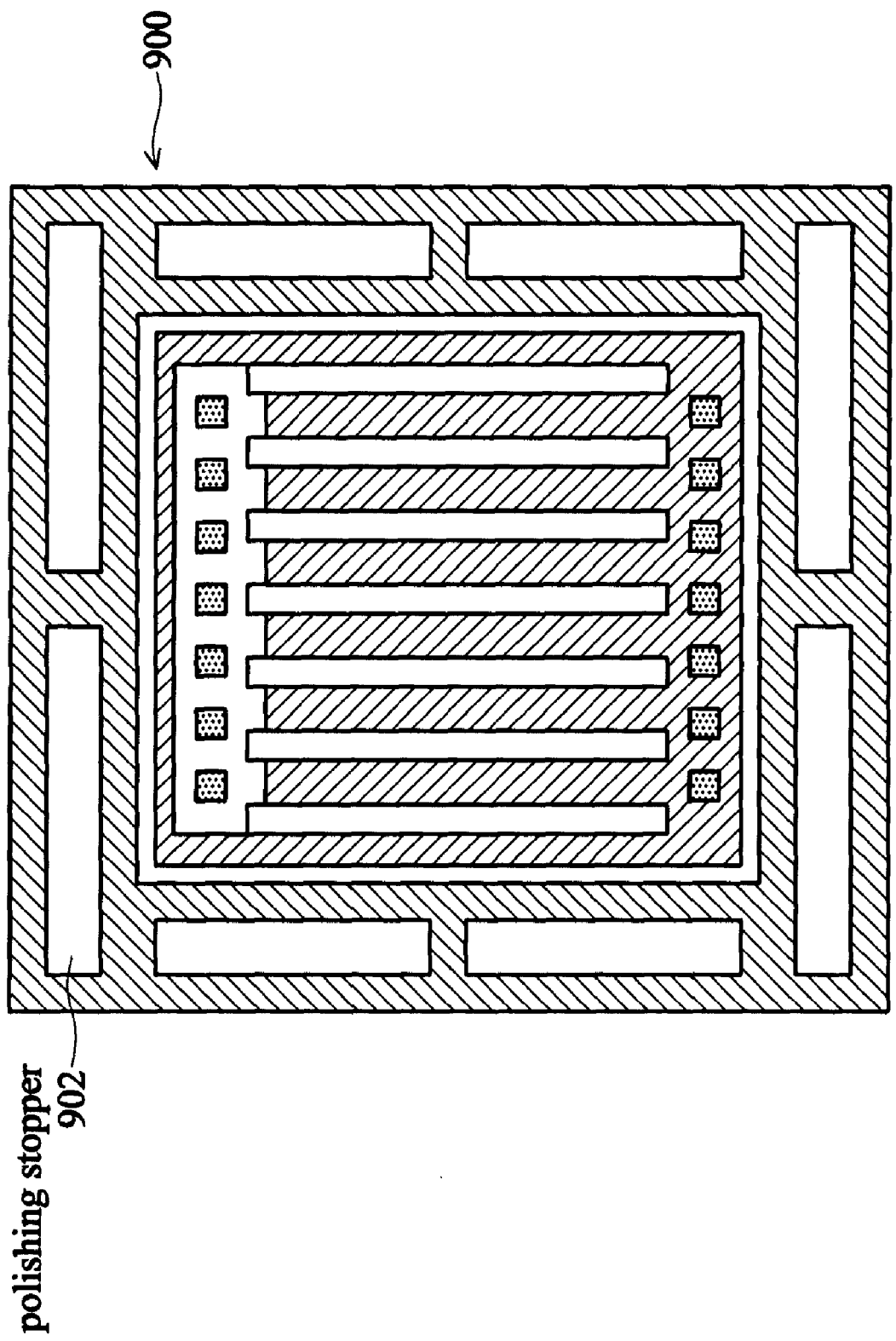
FIG. 9 is a top view of a capacitor array layout including another alternative stopping structure according to various aspects of the present disclosure.

Referring now to FIG. 9, illustrated is a top view of a capacitor array layout 900 with an alternative polishing stopping structure 902. The capacitor array layout 900 is similar to the capacitor layout 700 of FIG. 7 except for the shape and configuration of the polishing stopping structures 902. The polishing stopping structures 902 may include larger rectangular shapes that are positioned around the perimeter of the capacitor array (outside the capacitor array).

Figure 10:
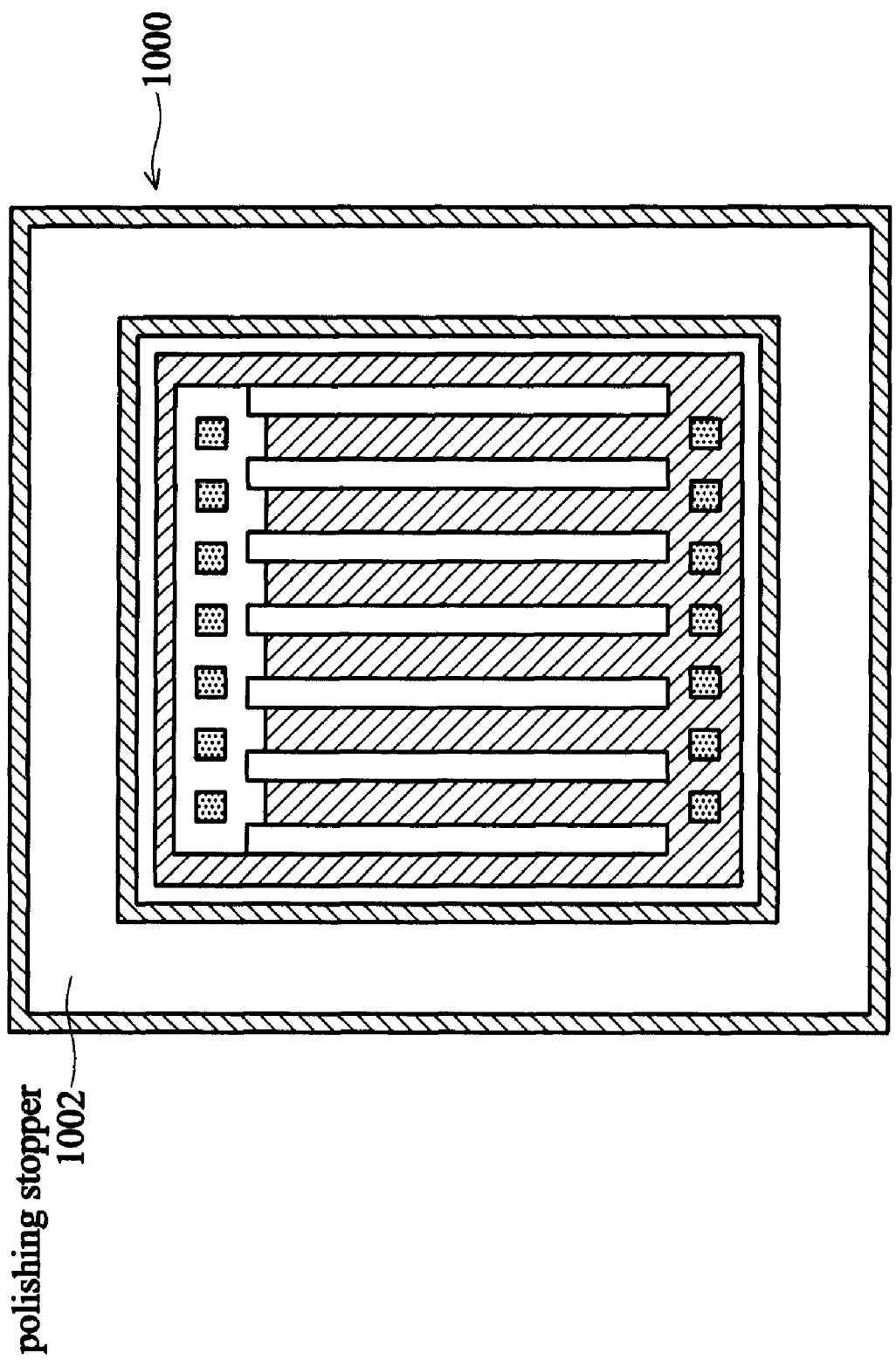
FIG. 10 is a top view of a capacitor array layout including still another alternative stopping structure according to various aspects of the present disclosure.

Referring now to FIG. 10, illustrated is a top view of a capacitor array layout 1000 with an alternative polishing stopping structure 1002. The capacitor array layout 1000 is similar to the capacitor layout 700 of FIG. 7 except for the shape and configuration of the polishing stopping structure 1002. The polishing stopping structure 1002 may include a ring-type structure having a rectangular shape. Alternatively, the ring-type structure may optionally include a square shape, an ellipse shape, a circular shape, or other suitable shape.

In summary, a gate last process may be implemented to form metal gate structures after formation of source/drain regions of transistors. The gate last process have been observed to be effective in reducing complexity of the front-end-of-the-line (FEOL) process and FEOL defect counts. Also, the gate last process can improve PFET mobility of up to 27%. However, problems with integrating other device technologies with the gate last process have arisen. Accordingly, the present disclosure provides a device and method that includes a polishing stopping structure that prevents or reduces the risk of a CMP process (ILD CMP and metal CMP) from over-polishing and damaging the top electrode of a capacitor. The polishing stopping structure may be formed in the same process as the process that forms the gate structure, and thus the device and methods disclosed herein do not require additional processing steps and/or added complexity and costs associated with processing steps already in use.

Thus, provided is a semiconductor device that includes a semiconductor substrate having a first region and a second region, a plurality of transistors having metal gates formed in the first region, and at least one capacitor formed in the second region. The capacitor includes a top electrode having at least one stopping structure formed therein, the at least one stopping structure being of a different material from the top electrode, a bottom electrode; and a dielectric layer interposed between the top electrode and the bottom electrode. In some embodiments, the capacitor includes an area of at least 0.5 um by 0.5 um. In some other embodiments, the at least one stopping structure includes a pillar-type structure having one of a rectangular shape, a square shape, an ellipse shape, and a circular shape. In still other embodiments, the at least one stopping structure includes a dielectric material. In yet other embodiments, the dielectric material includes one of a silicon nitride and a silicon oxide.

In other embodiments, the dielectric layer of the capacitor includes a high k dielectric material. In some other embodiments, the dielectric layer of the capacitor is formed of substantially the same material as a gate dielectric of the plurality of transistors. In some embodiments, the top electrode is formed of a material that is substantially the same as the metal gate of the plurality of transistors. In other embodiments, the at least one stopping structure is formed in the same process that forms the metal gates of the plurality of transistors in the first region. In some other embodiments, the at least one stopping structure covers at least 5% of a pattern density of the capacitor in the second region. In still other embodiments, a size of the at least one stopping structure is substantially not less than a minimum gate size of the plurality of transistors in the first region.

Also, provided is a method for fabricating a semiconductor device that includes providing a semiconductor substrate having a first region and a second region, forming a plurality of transistors having metal gates in the first region; and forming at least one capacitor in the second region. The step of forming the at least one capacitor includes forming a top electrode having at least one stopping structure formed therein, the at least one stopping structure being of a different material from the top electrode, forming a bottom electrode, and forming a dielectric layer interposed between the top electrode and the bottom electrode. In some embodiments, the at least one stopping structure is formed by the same process that forms a gate structure of the plurality of transistors in the first region. In other embodiments, the step of forming the plurality of transistors includes performing a gate last process. In some other embodiments, the at least one stopping structure includes one of a silicon nitride stopping structure and a silicon oxide stopping structure. In still other embodiments, the plurality of transistors include spacers formed on the sidewalls of the metal gates and wherein the at least one stopping structure is formed of a material that is substantially the same as the spacers. In yet other embodiments, the top electrode is formed of a material that is substantially the same as the metal gates of the plurality of transistors in the first region.

Further, provided is a semiconductor device that includes a semiconductor substrate having a first region and a second region, a plurality of transistors each having a high k dielectric/metal gate structure, the transistors being formed in the first region, a capacitor array formed in the second region; and a stopping structure formed in the second region and proximate to the capacitor array, the stopping structure being formed in the same process that forms a gate structure of the plurality of transistors in the first region. In some embodiments, the stopping structure includes a continuous ring-type structure surrounding the capacitor array, the continuous ring-type structure having one of a rectangular shape, a square shape, an ellipse shape, and a circular shape. In some other embodiments, wherein the stopping structure includes a plurality of pillars surrounding the capacitor array, the pillars each having one of a rectangular shape, a square shape, an ellipse shape, and a circular shape.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A semiconductor device, comprising:
    a semiconductor substrate having a first region and a second region;
        a plurality of transistors having metal gates and spacers formed in the first region; and
        at least one capacitor formed in the second region, the at least one capacitor including:
            a top electrode having at least one stopping structure formed therein, the at least one stopping structure being of a different material from the top electrode and in physical contact with the top electrode, and the at least one stopping structure being formed of the same material as the spacers of the plurality of transistors;
            a bottom electrode formed by the substrate; and
            a dielectric layer interposed between the top electrode and the bottom electrode, the at least one stopping structure being in physical contact with the dielectric layer and extending from the dielectric layer to a top surface of the top electrode.

2. The semiconductor device of claim 1, wherein the at least one capacitor includes an area of at least 0.5 um by 0.5 um.

3. The semiconductor device of claim 1, wherein the at least one stopping structure includes a pillar-type structure having one of a rectangular shape, a square shape, an ellipse shape, and a circular shape.

4. The semiconductor device of claim 1, wherein the at least one stopping structure includes a dielectric material.

5. The semiconductor device of claim 4, wherein the dielectric material includes one of a silicon nitride and a silicon oxide.

6. The semiconductor device of claim 1, wherein the dielectric layer includes a high k dielectric material.

7. The semiconductor device of claim 6, wherein the dielectric layer is formed of substantially the same material as a gate dielectric of the plurality of transistors.

8. The semiconductor device of claim 1, wherein the top electrode is formed of a material that is substantially the same as the metal gate of the plurality of transistors.

9. The semiconductor device of claim 1, wherein the at least one stopping structure is formed in the same process that forms the metal gates of the plurality of transistors in the first region.

10. The semiconductor device of claim 1, wherein the at least one stopping structure covers at least 5% of a pattern density of the capacitor in the second region.

11. The semiconductor device of claim 1, wherein a size of the at least one stopping structure is substantially not less than a minimum gate size of the plurality of transistors in the first region.

12. A method for fabricating a semiconductor device, the method comprising:
    providing a semiconductor substrate having a first region and a second region;
    forming a plurality of transistors having metal gates in the first region; and
    forming at least one capacitor in the second region, wherein forming the at least one capacitor includes:
        forming a top electrode having at least one stopping structure formed therein, the at least one stopping structure being of a different material from the top electrode;
        forming a bottom electrode; and
        forming a dielectric layer interposed between the top electrode and the bottom electrode;
    wherein the at least one stopping structure is formed by the same process that forms a gate structure of the plurality of transistors in the first region.

13. The method of claim 12, wherein the forming the plurality of transistors includes performing a gate last process.

14. The method of claim 12, wherein the at least one stopping structure includes one of a silicon nitride stopping structure and a silicon oxide stopping structure.

15. The method of claim 12, wherein the plurality of transistors include spacers formed on the sidewalls of the metal gates and wherein the at least one stopping structure is formed of a material that is substantially the same as the spacers.

16. The method of claim 12, wherein the top electrode is formed of a material that is substantially the same as the metal gates of the plurality of transistors in the first region.

17. A semiconductor device, comprising:
    a semiconductor substrate having a first region and a second region;
    a plurality of transistors each having a high k dielectric/metal gate structure, the transistors being formed in the first region;
    a capacitor array formed in the second region;
    a stopping structure formed in the second region and proximate to and surrounding the capacitor array, the stopping structure being formed in the same process that forms a gate structure of the plurality of transistors in the first region; and
    a conductive material formed in the second region and in physical contact with the stopping structure, the conductive material being interposed between the stopping structure and the capacitor array.

18. The semiconductor device of claim 17, wherein the stopping structure includes a continuous ring-type structure surrounding the capacitor array, the continuous ring-type structure having one of a rectangular shape, a square shape, an ellipse shape, and a circular shape.

19. A semiconductor device, comprising:
    a semiconductor substrate having a first region and a second region;

a plurality of transistors each having a high k dielectric/metal gate structure, the transistors being formed in the first region;

a capacitor array formed in the second region;

a stopping structure formed in the second region and proximate to the capacitor array, the stopping structure being formed in the same process that forms a gate structure of the plurality of transistors in the first region; and a conductive material formed in the second region and in physical contact with the stopping structure, the conductive material being interposed between the stopping structure and the capacitor array;

wherein the stopping structure includes a plurality of pillars surrounding the capacitor array, the pillars each having one of a rectangular shape, a square shape, an ellipse shape, and a circular shape.

20. The semiconductor device of claim 17, wherein the stopping structure includes a plurality of pillars surrounding the capacitor array.

* * * * *